US008048481B2

(12) United States Patent
Bellmann et al.

(10) Patent No.: US 8,048,481 B2
(45) Date of Patent: Nov. 1, 2011

(54) METHOD OF MANUFACTURING A COATING OR DOCTORING BLADE

(75) Inventors: Günter Bellmann, Commugny (CH); Silvano Freti, St. Prex (CH)

(73) Assignee: BTG Eclepens, S.A., Eclepens (CH)

(*) Notice: Subject to any disclaimer, the term of this patent is extended or adjusted under 35 U.S.C. 154(b) by 998 days.

(21) Appl. No.: 11/793,811

(22) PCT Filed: Dec. 21, 2005

(86) PCT No.: PCT/EP2005/013761
§ 371 (c)(1),
(2), (4) Date: Aug. 22, 2007

(87) PCT Pub. No.: WO2006/069688
PCT Pub. Date: Jul. 6, 2006

(65) Prior Publication Data

US 2008/0050563 A1 Feb. 28, 2008

(30) Foreign Application Priority Data

Dec. 28, 2004 (SE) ...................................... 0403178

(51) Int. Cl.

| | |
|---|---|
| ***B05D 3/12*** | (2006.01) |
| ***B05D 3/02*** | (2006.01) |
| ***B05D 3/04*** | (2006.01) |
| ***B29D 7/00*** | (2006.01) |
| ***D06M 15/643*** | (2006.01) |
| ***B21C 47/00*** | (2006.01) |
| ***C23C 14/56*** | (2006.01) |

(52) U.S. Cl. ..... 427/177; 427/178; 427/289; 427/372.2; 427/377; 427/378

(58) Field of Classification Search .................. 427/177, 427/178, 289, 290, 372.2, 377, 378, 379, 427/444
See application file for complete search history.

(56) References Cited

U.S. PATENT DOCUMENTS 6,733,834 B1 * 5/2004 Bellmann et al. ............ 427/289

FOREIGN PATENT DOCUMENTS

| | | |
|---|---|---|
| WO | WO 00/48746 | 8/2000 |
| WO | WO 2004/007092 | 1/2004 |
| WO | WO 2004007092 A1 * | 1/2004 |

OTHER PUBLICATIONS

International Search Report for International Application No. PCT/EP2005/013761 dated Mar. 10, 2006.
International Preliminary Report on Patentability and Written Opinion of the International Searching Authority for International Application No. PCT/EP2005/013761 dated Jul. 3, 2007.

* cited by examiner

*Primary Examiner* — Frederick Parker
*Assistant Examiner* — Michael Wieczorek
(74) *Attorney, Agent, or Firm* — Buchanan Ingersoll Rooney PC

(57) ABSTRACT

There is disclosed a method for the manufacture of coating or doctoring blades, wherein an elastomeric wear-resistant material at the blade tip is provided in a continuous process. During the manufacturing, the thickness of the applied elastomeric material is determined by winding the blade (containing the applied polymer composition) into a coil before the applied composition is fully cured. Successive turns of the coil are separated by a distance which is smaller than the initial thickness of the applied composition, such that the only partly cured composition is deformed by adjacent turns of the coil into the desired thickness and/or shape.

22 Claims, 4 Drawing Sheets

METHOD OF MANUFACTURING A COATING OR DOCTORING BLADE

TECHNICAL FIELD OF THE INVENTION

The present invention relates to a method of manufacturing coating or doctoring blades provided with a soft, elastomeric tip. The invention also relates to a blade which may be produced by means of the inventive method.

BACKGROUND OF THE INVENTION

EP 1 156 889 B1 discloses a continuous process for manufacturing coating or doctoring blades, which at their working tip are provided with a wear resistant soft or rubbery elastomeric material. The soft or rubbery material at the blade tip is provided using ultra fast-curing elastomeric compositions in a continuous process. The previous problems related to the use of closed moulds for providing the tip material were avoided in a convenient manner by the process disclosed by EP 1 156 889. In short, the process comprised the application of the fast-curing polymer composition by means of a treatment station which was given a relative movement with respect to a blade substrate in the form of a band. The applied composition was then allowed to spread out so as to reach the very extreme of the edge of the blade substrate, whereupon the composition was cured to form an elastic and tack-free coating.

The geometrical profile of the applied composition obtained by the above process is determined by the rheological properties and the reactivity of the applied composition, such as flow characteristics, rate of viscosity increase, etc., thus allowing control only of the width of the applied composition. Parameters that could be adjusted were the properties of the polymer composition, the casting output, and the relative speed between the treatment station and the blade substrate.

Although giving some important advantages compared to still older technology, the process of the above ’889 patent still require a great deal of post processing, such as cutting, machining, grinding or the like in order to obtain a controlled profile having a constant and well controlled thickness.

SUMMARY OF THE INVENTION

FIG. 1 shows schematically a blade 10 tipped with an elastomeric composition 12 as obtained from the prior art manufacturing process itself. As explained above, grinding and post-processing is required in order to form the elastomeric composition into the desired shape and thickness.

The present invention provides a method by which the wear resistant composition 22 of the blade 20 is formed into the desired thickness already during the casting procedure. The profile of the blade 20 obtained by the method according to the invention is schematically shown in FIG. 2.

In practical use of a coating or doctoring blade having a tip material 22 comprised of an elastomeric material, the profile of the wear-resistant material 22 has several implications for the coating or doctoring process. This is illustrated in FIGS. 3*a* and 3*b*. As illustrated in FIG. 3*a*, a beveled tip 24 of the blade 20 is, during use, in contact with the coating color 26 and the base material 28 (such as a paper web moving in the direction of arrow W in FIG. 3). This working bevel 24 provides the high wear resistance and the very specific fiber coverage of the coated paper 29 obtained with elastomeric-tipped blades. During coating, the top surface 30 of the elastomeric material 22 is constantly hit by coating color 26, traveling at the speed of the paper web 28. In this way, excess coating color metered off by the blade 20 is redirected back towards the coating color circuit (not shown), as illustrated by the arrow R in FIG. 3, leaving the desired coating thickness for the coated paper 29. The coating color that is in contact with this top surface 30 of the elastomeric material 22 is subject to large changes in speed and flow direction. In many cases, in particular when using coating colors of high solids content, a build-up of solid coating color pigments 32 is being created and remains stuck to the top surface 30. This build-up 32 on the top surface 30 of the blade may lead to alteration or even obstruction of the flow of coating color 26. Moreover, dried pieces of coating color may detach from the surface and become entrapped under the beveled tip surface 24 or pass under the blade. This kind of events typically create linear defects on the coated paper web 29 called “streaks”. Hence, surface properties of the elastomeric material 22 on the top surface 30, such as friction coefficient and/or surface tension (non-stick properties) are important factors for the practical lifetime of the blade and for the coating quality of the prepared paper product.

FIG. 3*b* shows schematically a doctoring blade in a flexographic or rotogravure printing process. Open cells 23 on anilox or chrome-plated gravure-rolls are filled with ink 25. The doctor blade provided with the elastomeric tip material 22 removes the excess ink from the roll surface 31, leaving only the cells 23 filled with ink after the doctoring process. The blade tip material can be either provided with a bevel 24 similar to what is shown in FIG. 3*a*, or be without any bevel, as shown at 27 in FIG. 3*b*. In both cases, there is a need to control the hardness of the elastomeric tip material 22, ensuring a consistent doctoring effect from one blade to the other.

While the method disclosed in EP 1 156 889 is efficient, in that volumes of blades may be cast at high rates, it is not very versatile. All properties of the blade tip material relating to shape, geometry and surface characteristics are typically provided in post-processing steps. However, such post processing is time-consuming and costly. Therefore, there is a general need in the prior art for a manufacturing process in which the need for post processing is minimized or reduced.

Hence, it is an object of the present invention to provide a versatile process for the manufacture of elastomeric-tipped blades of the above kind, in which the need for post processing is reduced.

This object is met by a method as set forth in the appended claims.

It is also an object to provide a coating or doctoring blade having a wear-resistant polymer tip material at an edge section thereof subjected to wear, wherein a top surface and a working bevel of said wear-resistant polymer have different surface properties.

In particular, there is provided a coating blade having a working tip provided with a wear resistant soft or rubbery elastomeric material, wherein a beveled tip surface exposes the elastomeric material and wherein a top surface, facing the flowing coating color during use, is provided with a non-stick surface layer. An advantageous effect obtained when using this kind of coating blade is that build-up of solid coating color pigments or similar on the top surface of the blade is reduced, leading to a longer service life for the blade and improved coating quality for the produced coated product.

In general, there is provided a method for manufacturing a metering or doctoring blade which is covered at the tip with a wear resistant, soft or rubbery material using elastomeric, ultra fast-curing polymer compositions. The fast-curing composition is applied to a blade substrate in liquid form and allowed to spread out to some extent. Before the polymer composition is fully cured, the blade substrate (with the applied polymer composition) is wound up into a coil, such that each successive turn of the coil functions as an open mould, deforming the cast and still not fully cured polymer of adjacent turns into the desired shape and/or thickness. In this way, the post processing of grinding the blade tip material into the desired, regular form is facilitated, since the material is given the desired thickness "in-line" by way of the coiling.

Preferably, the winding of the blade substrate onto a coil is performed while simultaneously introducing a spacer between successive turns, such that a well-defined equidistant spacing is obtained. This spacing then determines the final height (thickness) of the elastomeric material provided on the blade.

The winding of the blade substrate onto the coil is typically performed while keeping a constant torque on the coil reel, thus producing a similar deformation load on each turn of the coil. This deformation load may then be maintained until the polymer composition is further cured in order to fix the profile of the cast elastomeric material. The final curing may be effected by an optional post-curing step.

The method according to the present invention has some important advantages, besides the reduced need for post processing. In short, the blades can be given different properties on different surfaces thereof in order to meet specific needs.

Blades tipped with an elastomeric material, e.g. as disclosed in EP 1 156 889, are sometimes known as metering blades. The amount of liquid left on the travelling web (such as coating color on a paper web) is determined by the type of liquid, the blade profile, the blade holder settings (pressure against the web) and by all the hydrodynamic conditions, in particular the relative speed between the blade and the travelling web. In some applications, use is made of so-called volumetric metering, wherein a doctoring or metering device is provided with a regular pattern which allows transfer of a particular volume of coating liquid onto the web. For example, grooved metering rods may be employed for this purpose (see for example EP 1 027 470). Such metering rods are mounted in a support comprising a rod bed, a motor drive for rotating the rod, and a water lubrication/cooling system between the rod and the rod bed. The possibility to produce blades tipped with an elastomeric material having surface patterns for volumetric metering may allow the replacement of this rather complicated system for volumetric metering by a simple blade holder and a metering blade that is volumetric per se.

In addition, the method according to the present invention allows for the provision of specific properties to the top surface of the elastomeric material. For example, the top surface may be provided with a surface structure for volumetric purposes, or with various chemical or physical surface characteristics. After manufacture, when the front bevel is formed (e.g. by grinding), the inherent properties of the bulk elastomeric material are exposed for this surface. However, the various properties applied to the top surface remain. Referring again to FIG. 3*a* of the drawings, it is evident that this provides for a very advantageous "decoupling" of the surface properties of the top surface and the front bevel.

During manufacture, specific properties are conveniently applied to the top surface of the elastomeric coating by means of a tape or the like, which is introduced between successive turns of the blade during the winding of the blade into a coil.

Hence, the present invention offers some attractive improvements over the prior art by providing a method of manufacturing blades, with the option to make blades having i) a well defined elastomer thickness; ii) decoupled surface properties between the working front bevel and the top surface; and/or iii) surface patterns on the top surface for volumetric metering. Also, it is envisaged that the skilled person will find further advantageous uses of the present invention.

BRIEF DESCRIPTION OF THE DRAWINGS

In the following, the present invention will be described in more detail, by reference to some illustrative examples. The following description refers to the drawings, on which.

DETAILED DESCRIPTION OF PREFERRED EMBODIMENTS

Figure 1:
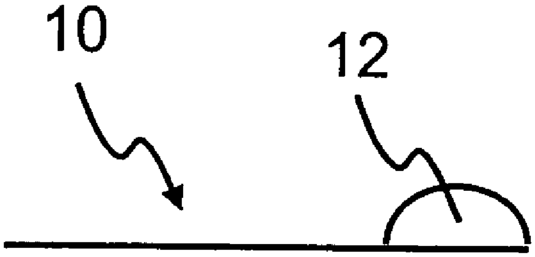
Fig. 1 (Prior Art)
FIG. 1 shows schematically the profile of a blade having an elastomeric wear-resistant material at the working tip, as obtained by the prior art process referred to above.

In FIG. 1, there is shown a schematic side view of a blade 10 coated with a wear-resistant polymer composition 12 at a longitudinal edge section thereof. The figure shows the profile of the polymer composition as it is obtained by the prior art process described in EP 1 156 889. After the application of the wear-resistant tip material, the blade typically undergoes a grinding procedure in order for the coating to be formed into the desired shape and thickness. After the grinding procedure, the profile of the blade looks substantially as schematically shown in FIG. 2.

Figure 2:
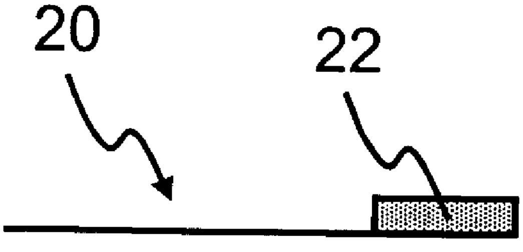
FIG. 2 shows schematically the profile of a blade having an elastomeric wear-resistant material at the working tip, as obtained by the method of the invention.

The present invention provides a method for manufacturing a coating or doctoring blade 20, in which the profile as shown in FIG. 2 is obtained directly from the casting process, thus facilitating any post-treatment of the blade 20 significantly.

Figure 4:
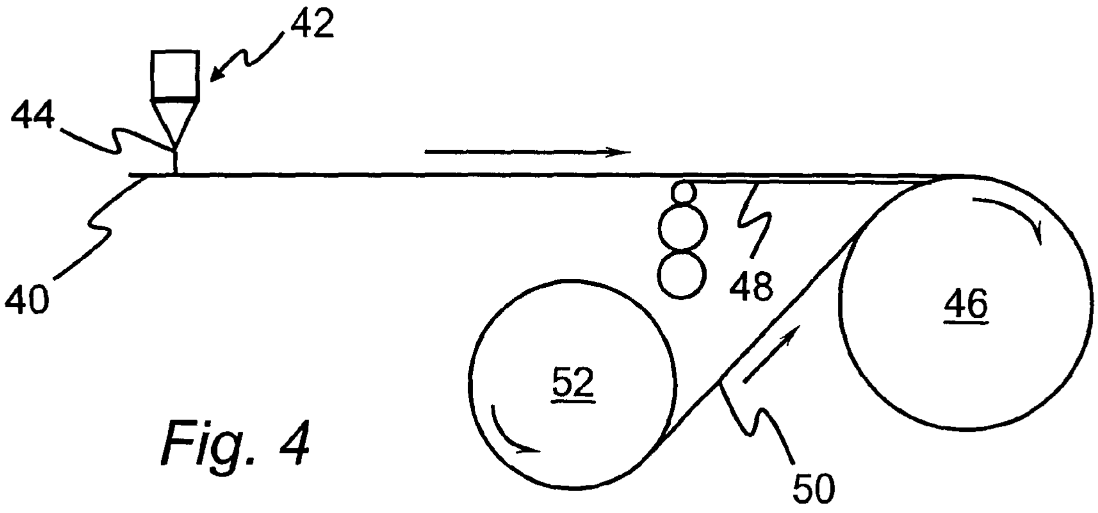
FIG. 4 shows schematically one example of a set-up for carrying out the method according to the invention.

FIG. 4 shows schematically one example of a set-up for carrying out the method according to the invention. A blade substrate 40, preferably a band of steel, is supplied from a storage reel (not shown) and passes a mixing, dosing and dispensing machine 42 capable of handling ultra-fast curing, multi-component polymer compositions. The mixed resin components are poured directly from the dispenser 42 onto the blade substrate 40, as illustrated at 44 in FIG. 4. During the manufacturing process, the blade is continuously coiled up on a collection reel 46. The distance between the dispenser 42 and the collection reel 46, and the speed of the blade substrate, are selected such that the polymer composition applied to the substrate is tack-free but not yet fully cured when it is coiled onto the reel 46. Before coiling, a functional tape 48 or the like may be applied to the blade substrate, in order to provide various surface characteristics to the polymer coating (this will be described in more detail below). During winding onto the reel 46, a spacer 50 may be introduced between each turn of the coil in order to make adjacent turns of the coil equidistant. The separation between turns of the coil (i.e. the thickness of the spacer) is smaller than the initial thickness of the applied polymer composition, this applied composition thereby being deformed during coiling into the desired thickness, as determined by the separation between turns of the coil (thickness of the spacer 50). The spacer 50 may be continuously supplied from a corresponding storage reel 52.

Although it is preferred to use the spacer 50 for controlling the thickness of the elastomeric tip material, use could also be made of the torque applied to the collection reel 46. In this manner, the deformation load could be controlled without the use of a separate spacer 50.

Figure 5:
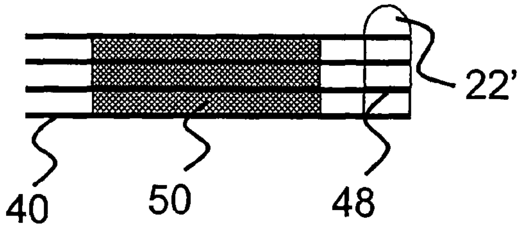
FIG. 5 shows schematically a side view of the coiled blade according to the invention.
Figure 6:
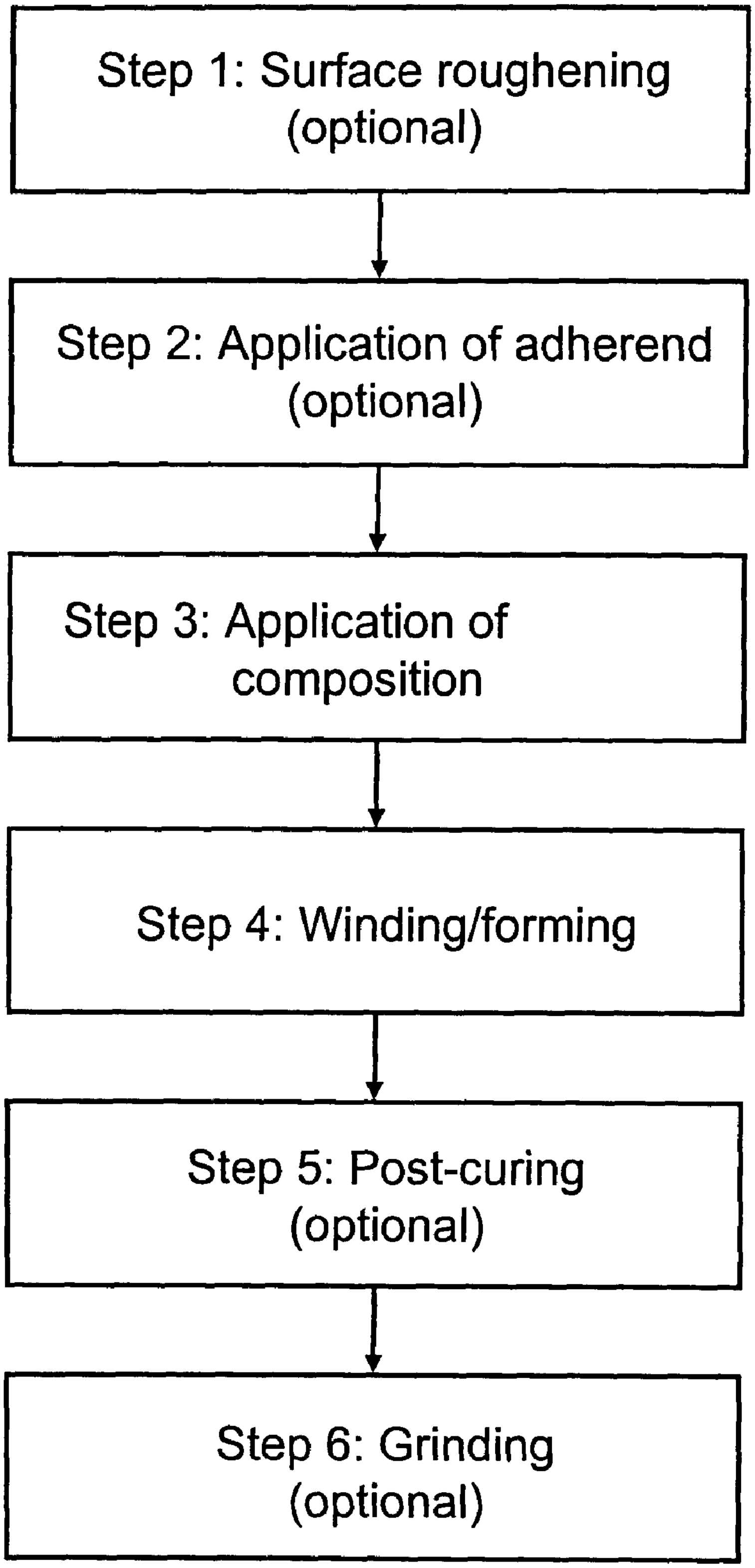
FIG. 6 is a flow diagram of the method according to the invention.

FIG. 5 shows a side view of the blade as it is coiled upon the reel 46. Successive turns of the blade substrate 40 are shown to be separated by the spacer 50, such that the initial thickness of the applied polymer 22' is deformed into the same thickness as the spacer 50. If a tape 48 was introduced, such tape would be located between each turn, on top of the polymer deposit.

The typical steps involved in the method according to the present invention will now be described with reference to a preferred embodiment. It should be noted, however, that some of the steps described below are optional.

Step 1 The manufacturing process starts from a base substrate of, for example, cold-rolled metal. The base substrate has the form of a band or strip, having a thickness of 0.1-1.5 mm, a width of 50-200 mm, and a length of up to 100 m or more. The surface area of the substrate upon which the rubbery deposit is to be applied is preferably roughened by sand or grit blasting. The substrate may then be degreased and cleaned. The roughened area is normally a longitudinal section of the substrate and has a width of about 5 mm to about 20 mm, depending on the intended use for the blade. This step is an optional but preferred step.

Step 2 After the substrate has been roughened in appropriate areas, a primer or adherend may be applied. In order to achieve good adhesion between the elastomeric material composition and the base substrate, the application of an intermediate bonding layer is sometimes appropriate. The primer or adherend is preferably a solvent-free, solvent-based or water-borne adherend solution. The adherend solution may advantageously be applied over the roughened areas by spraying, brushing, roller coating, doctoring, flow coating, etc., such as to produce an even and smooth coating of 5-30 μm dry thickness. In order to assist and accelerate the evaporation of solvent (if present) or water, the blade may typically be passed through a hot-air tunnel, the coating thus becoming tack-free and the blade substrate ready for winding into a coil. This step is an optional but preferred step.

Step 3 Application of the rubbery composition on top of the adherend intermediate layer is achieved using a low or high pressure mixing, dosing and dispensing machine capable of handling ultra-fast curing multi-component resin systems having pot-lives as short as 5-30 seconds. The mixed resin components are poured directly from the mixing chamber onto the blade substrate, where there is provided a relative movement between the blade substrate and the dispensing machine (dispensing head). During the pot-life of the composition (5-30 seconds), the resin may spread out, preferably until it reaches the edge of the substrate. Then, after this short time of 5-30 seconds, the viscosity of the composition increases due to reaction of the components (initial curing), thus preventing further spreading out or dripping off the substrate edge. By the time the applied resin reaches the wind-up roll, it has hardened (cured) to the extent that it is substantially tack-free but still susceptible to deformation by application of an external load. Hence, the coated blade is typically wound up onto the coil within the gel time of the polymer composition.

Figure 3A:
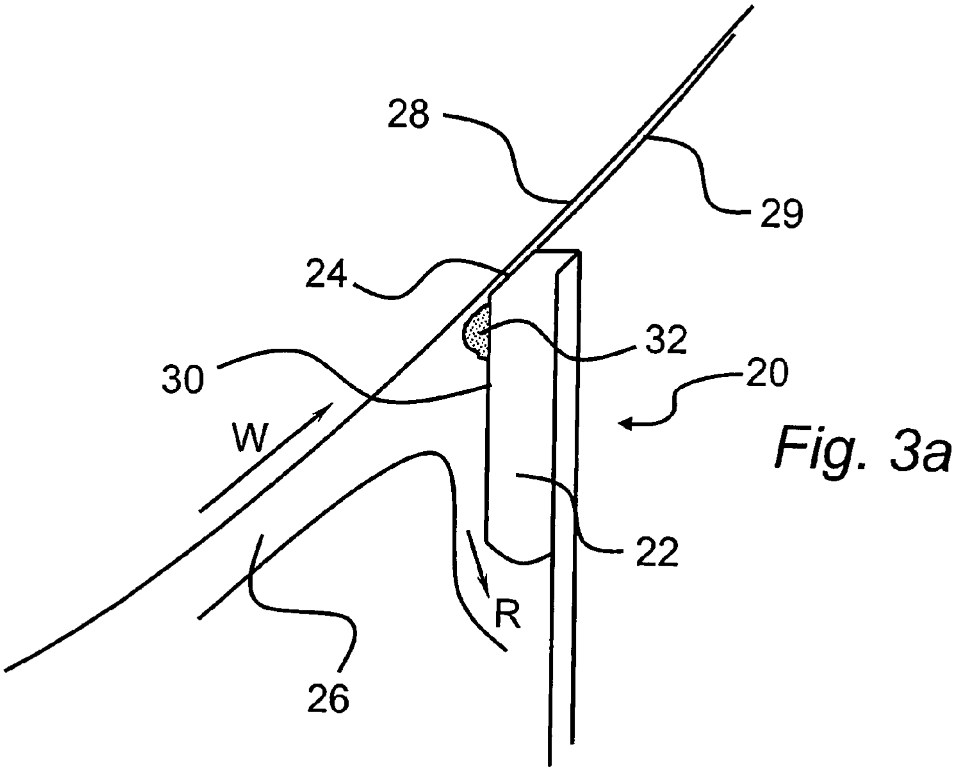
FIG. 3*a* is a view showing the blade in use as a coating blade.
Figure 3B:
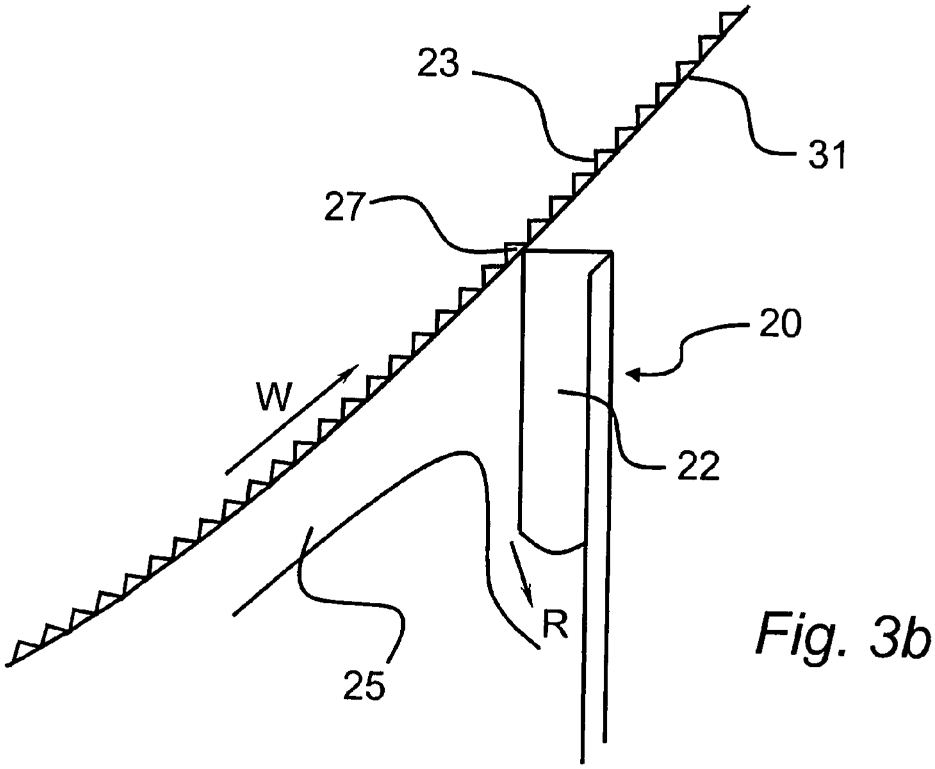
FIG. 3*b* is a view showing the blade in use as a doctoring blade.

Step 4 The next step may address both profile control and surface properties for the applied composition, and is carried out during winding-up of the coated substrate into a coil. The profile of the elastomeric coating is preferably determined by winding the substrate onto a coil together with a spacer. The spacer has a thickness which is smaller than the initial thickness of the partly cured elastomeric deposit cast on the substrate. In effect, the cast material will come into contact with the previous or the next (depending on the orientation) turn on the coil, thus deforming the cast material to the extent determined by the spacing between turns (e.g. as determined by the thickness of the spacer), while at the same time reproducing the back surface of the adjacent coil (in negative). This is schematically illustrated in FIG. 4. The winding of the blade strip onto the coil is typically performed at a constant torque, thus producing a similar deformation load on each individual turn of the coil. The successive turns of the coil are typically radially equidistant, such that a constant thickness is obtained for the applied composition. The load is maintained until the elastomeric deposit has been further cured, e.g. in a subsequent post-curing step as described below. The provision of various surface characteristics for the top surface of the elastomeric deposit is also made during the winding. To this end, an appropriate tape or the like, optionally covered on one side with an adhesive capable of interacting chemically with the partly cured elastomeric material, may be unwound in a separate device and introduced into the nip formed by the last turn of the coil and the strip just being wound up onto the coil. The tape is applied on top of the cast elastomeric material such that the tape and the elastomeric material are pressed together forming the desired composite structure (with the adhesive side of the tape against the elastomeric material). At the same time, the profile of the elastomer is controlled by the mechanism described above. In a similar way, a structured surface of the elastomer can be obtained by using a structured tape, wherein the tape structure is replicated in negative onto the elastomeric material (typically using a tape without adhesive), or wherein a composite structure incorporating the tape itself is formed (with an adhesive side of the tape against the elastomeric material). The tape or the spacer may be further profiled to achieve after removal a near net shape profile of the elastomeric material, such as a front bevel 24 shown in FIG. 3*a*.

Step 5 As a further optional step, the cast elastomeric deposit can undergo a thermal treatment in a post-curing step. This will typically be performed while the blade strip is still being wound into a coil by introducing the coil (reel) into a circulated-air oven at an elevated temperature. For example, the coiled strip may be kept for 16-24 hours at a temperature of about 80°-85°. After this post-curing treatment, the profile and the functional layer of the elastomeric material are definitely fixed, and the spacer can be removed and the blade may be unwound from the coil.

Step 6 Finally, the elastomeric blade material is typically ground to the desired shape and geometry, and the blades are cut into appropriate dimensions. For example, the working front bevel may be formed during this step if not already obtained in step 4 above, e.g. by using a profiled tape or spacer or the like.

Having described the various processing steps above, some practical examples will be given below.

Example 1

This example shows the manufacture of coating or doctoring blades with an elastomeric material applied at the blade tip. The elastomeric-material blade tip has a controlled profile and is provided in a continuous manner.

Steps 1 and 2 A reel of cold rolled steel having a thickness of 0.457 mm, a width of 100 mm and a length of 100 m is sand blasted on one side over an area forming a 13 mm wide, longitudinal strip from one edge. The blasting is performed using Edelkorund Weiss (WSK) F 180 (Treibacher). The roughened surface area is coated in a continuous manner with a bonding agent such as Cilbond 49 SF (CIL), which is used for promoting adhesion of cast polyurethanes to steel. The bonding agent solution is applied, without dilution, by means of a 0.15 mm thick and 4 cm wide bent steel blade, so as to cover the entire sand blasted area with a regular and smooth film of approximately 15 μm dry thickness. After evaporation of the solvent, the reel of coated steel is cured in a circulated-air oven at 100° C. for 2 hours.

Steps 3-6 The liquid elastomer composition used for casting on the blade is applied on top of the bonding agent by means of a low pressure mixing, dosing and dispensing machine. The composition is comprised of an MDI/Polyether prepolymer Adiprene RFA 1001 (Crompton) and a chain extender Adiprene RFB 1070 (Crompton). The pot-life is 25-30 seconds. The liquid mix is applied with an output of 0.30 kg/min at 0.5 cm of the edge within the 13 mm wide bonding agent strip on the substrate, moving at a linear speed of 10 m/min. The moving substrate is wound up 4 meters away from the pouring point, thus leaving sufficient time for the composition to gelify and become tack-free. The spacer used for controlling the profile of the cast elastomer composition has a thickness of 1.9 mm, a width of 70 mm and a total length of 120 meters. The reel or coil of wound substrate and spacer is then submitted to a heat treatment in a circulated-air oven at 85° for 24 hours. After cooling down, the reel is unwound and the now fully cured elastomer strip has a hardness according to Shore A of 70, a width of 12 mm, and a flat, well controlled profile having a thickness of 1.9 mm (equal to the spacer thickness). Finally, the blade is ground in a continuous way to the final blade geometry, and then cut into the desired lengths.

Example 2

This example shows the manufacture of elastomeric material-tipped blades with a controlled profile and functional surface properties.

Steps 1 and 2 The initial steps are performed in the same manner as described in Example 1 above.

Steps 3-6 The liquid cast elastomer composition used for casting on the blade is applied on top of the bonding agent by means of a low pressure mixing, dosing and dispensing machine. The composition is comprised of an MDI/Polyether prepolymer Adiprene RFA 1001 (Crompton) and a chain extender Adiprene RFB 1070 (Crompton). The pot-life is 25-30 seconds. The liquid mix is applied with an output of 0.30 kg/min at 0.5 cm of the blade edge within the 13 mm wide bonding agent strip on the substrate, moving at a linear speed of 10 m/min. The moving substrate is wound up 4 meters away from the pouring point, thus leaving sufficient time for the composition to gelify and become tack-free. The spacer used for controlling the profile of the cast elastomer composition has a thickness of 1.9 mm, a width of 70 mm and a total length of 120 m. At the same time, a PTFE (poly (tetrafluoroethylene)) adhesive tape having a width of 12.7 mm and a thickness of 0.09 mm (3M 5490) is introduced into the nip formed by the last turn of the coil and the substrate just being wound up, on top of the cast elastomeric material such that the tape and the cast elastomeric material are pressed together (with the adhesive side of the tape against the cast elastomeric material), forming the desired composite structure, and simultaneously controlling the profile. The coil of wound substrate strip, spacer and tape is then subjected to a heat treatment in a circulated-air oven at 85° C. for 24 hours. After cooling down, the coil is unwound and the now fully cured elastomer strip has a PTFE functional surface, a width of 12.7 mm and a flat, well controlled profile with a thickness of 1.9 mm (equal to the spacer thickness). Finally, the blade is ground in a continuous manner to the final blade geometry, and then cut into the desired lengths.

The use of a PTFE tape as in Example 2 above has the advantageous effect that problems relating to coating color pigments getting stuck to the top surface of the blade are reduced or eliminated. Once the blade has been ground to its final geometry, and the working front bevel has been provided, the PTFE still remains on the top surface of the elastomeric coating. In effect, this provides for a non-stick surface, reducing during use of the blade the said adverse effects, which are frequently encountered in prior art technology.

In another practical example, the PTFE tape of Example 2 above is replaced by an ultra high molecular weight polyethylene (UHMW PE) having a thickness of 0.11 mm (3M 5425). In some cases, a tape of UHMW PE is preferred over the PTFE tape since the polyethylene tape is generally of lower cost.

In yet another practical example, the PTFE tape of Example 2 above is replaced by a structured tape (tape without adhesive), thus reproducing a negative replica of the tape structure onto the elastomeric material (the tape structure is pressed into the elastomeric material during winding).

The inventive method for manufacturing a coating or doctoring blade may be used for conveniently producing a blade for which the top surface and the working bevel have different surface properties. For example, the top surface may be provided with non-stick properties in order to avoid problems relating to the build-up of solid coating color pigments on said top surface. At the same time, the bulk properties of the applied elastomeric material may be revealed and used for example at the working bevel of the blade. Alternatively, the top surface of the applied elastomeric material may be provided with a surface structure for purposes of volumetric metering.

CONCLUSION

There has been disclosed a method for the manufacture of coating or doctoring blades, wherein an elastomeric wear-resistant material at the blade tip is provided in a continuous process. During the manufacturing, the thickness of the applied elastomeric material is determined by winding the blade (containing the applied polymer composition) into a coil before the applied composition is fully cured. Successive turns of the coil are separated by a distance which is smaller than the initial thickness of the applied composition, such that the partly cured composition is deformed by adjacent turns of the coil into the desired thickness and/or shape before being definitely cured.

Conveniently, the inventive method can be used for producing blades that have different surface properties for the top surface and for the working bevel; or for producing blades that have a structured top surface suitable for volumetric metering purposes.

The invention claimed is:

1. A method for manufacturing a coating or doctoring blade having a wear-resistant polymer tip material applied to a longitudinal edge section thereof subjected to wear, comprising the successive steps of:

applying a fast-curing polymer composition to a blade substrate;

allowing the applied composition to spread out and to partly cure, to form a tack-free tip material;

winding the tip material covered blade substrate into a coil such that successive turns of the coil function as an open mould, deforming the partly cured composition of adjacent turns into a desired shape and/or thickness, the separation between turns of the coil being smaller than the initial thickness of the applied composition, the applied composition thereby being deformed during winding into a desired thickness, as determined by the separation between turns of the coil; and allowing the applied composition to further cure while the blade substrate is still wound onto the coil.

2. The method as claimed in claim 1, wherein successive turns of the coil are equidistant, such that a constant thickness is obtained for the applied composition, the distance between the successive coils being from about 0.25 mm to about 3 mm.

3. The method as claimed in claim 1, wherein the distance between successive turns of the coil is determined by means of a spacer, which is introduced between the turns during said winding.

4. The method as claimed in claim 1, wherein the step of allowing the composition to further cure comprises post-curing the applied composition at an elevated temperature.

5. The method as claimed in claim 4, wherein the post-curing is performed by introducing the wound coil into a circulated-air oven at elevated temperature.

6. The method as claimed in claim 1, further comprising the step of applying a primer or adherend to the blade substrate prior to applying the polymer composition.

7. The method as claimed in claim 6, wherein the primer or adherend is applied to a dry thickness of 5-30 μm.

8. The method as claimed in claim 6, further comprising the step of roughening the blade substrate prior to applying the primer or adherend.

9. The method as claimed in claim 1, further comprising the step of post-grinding the coating or doctoring blade, to obtain a desired shape and geometry for the cured wear-resistant polymer tip material.

10. The method as claimed in claim 1, wherein the step of applying a fast-curing polymer is performed using a polymer composition having a pot-life of 5-30 seconds.

11. The method as claimed in claim 1, further comprising the step of introducing, during winding, a tape between the applied composition and the adjacent turn of the coil, said tape having the purpose of transferring desired properties or shape to the surface of the applied polymer composition.

12. The method as claimed in claim 11, wherein the side of the tape contacting the applied polymer composition is adhesive, such that the tape and the applied composition are pressed together and forms a composite structure at the surface of said composition.

13. The method as claimed in claim 11, wherein the side of the tape contacting the applied polymer composition is provided with a surface structure, which is replicated onto said applied polymer composition during the winding step.

14. The method as claimed in claim 11, further comprising the step of post-grinding coating or doctoring blade, to obtain a top surface having the properties transferred from said tape, and a ground surface having the properties of the applied polymer composition.

15. The method as claimed in claim 14, wherein the post-grinding is performed such that a front working bevel is obtained having the properties of the applied polymer composition.

16. The method as claimed in claim 11, wherein said tape comprises (poly)tetrafluoroethylene (PTFE) or ultra high molecular weight polyethylene (UHMW PE).

17. The method as claimed in claim 11, wherein said tape provides non-stick properties to a top surface of the polymer tip material.

18. The method as claimed in claim 1, wherein said fast-curing polymer composition is a polymer selected from polyurethanes, styrene-butadiene polymers, polyolefins, nitrile rubbers, natural rubbers, polyacrylates, polychloroprene, thermoplastic elastomers, and polysiloxanes.

19. The method as claimed in claim 18, wherein said fast-curing polymer composition is comprised of a polyurethane.

20. The method as claimed in claim 2, wherein the distance between successive turns of the coil is determined by means of a spacer, which is introduced between the turns during said winding.

21. The method of claim 4, wherein the post-curing is performed by introducing the wound coil into a circulated-air oven at a temperature of about 80° to 85° for 16 to 24 hours.

22. The method as claimed in claim 7, further comprising the step of roughening the blade substrate prior to applying the primer or adherend.

* * * * *